US005160403A

United States Patent [19]

Fisher et al.

[11] Patent Number: 5,160,403

[45] Date of Patent: Nov. 3, 1992

[54] PRECISION DICED ALIGNING SURFACES FOR DEVICES SUCH AS INK JET PRINTHEADS

[75] Inventors: Almon P. Fisher; Donald J. Drake, both of Rochester, N.Y.

[73] Assignee: Xerox Corporation, Stamford, Conn.

[21] Appl. No.: 742,802

[22] Filed: Aug. 9, 1991

[51] Int. Cl.[5] .................... H01L 21/306; H01L 21/00; B32B 31/00; B44C 1/22

[52] U.S. Cl. .................................... 156/633; 156/645; 156/647; 156/657; 156/662; 156/257; 156/258; 156/264; 156/304.5; 437/226

[58] Field of Search ............... 156/633, 644, 645, 647, 156/657, 659.1, 661.1, 662, 257, 258, 264, 304.1, 304.5; 437/226; 346/1.1, 75, 140 R; 83/875, 39

[56] References Cited

U.S. PATENT DOCUMENTS 4,786,357 11/1988 Campanelli et al. ................ 156/633
4,814,296 4/1989 Jedlicka et al. ...................... 437/226
4,822,755 4/1989 Hawkins et al. ..................... 437/227
4,829,324 5/1989 Drake et al. ..................... 346/140 R
4,851,371 7/1989 Fisher et al. ......................... 437/226
4,878,992 11/1989 Campanelli ......................... 156/633
5,000,811 3/1991 Campanelli ......................... 156/264

FOREIGN PATENT DOCUMENTS 58-52846 3/1983 Japan .
60-157236 8/1985 Japan .
2025107 1/1980 United Kingdom .

*Primary Examiner*—William A. Powell
*Attorney, Agent, or Firm*—Oliff & Berridge

[57] ABSTRACT

A method of fabricating a semiconductor device having a buttable edge from a first wafer having first and second opposite planar surfaces and a second wafer having first and second opposite planar surfaces is disclosed. A first component is formed on the first planar surface of the first wafer. A precision dice cut is placed in the first planar surface of the first wafer closely adjacent to the first component. The precision dice cut extends partially through the first surface of the first wafer and defines the buttable edge. The first surface of the first wafer is bonded to the first surface of the second wafer, the first surface of the second wafer containing a second component and being aligned with and bonded to the first wafer so that the first and second components cooperate to form the semiconductor device. Portions of the first and second wafers surrounding the first and second components, respectively, are then removed to define the semiconductor device. The step of removing can include placing a second dice cut entirely through the first and second wafers parallel to and slightly offset from the precision dice cut. The second dice cut being located slightly further away from the first component than the precision dice cut and intersects a portion of the precision dice cut so that a side of the semiconductor device which includes the buttable edge is defined by the precision dice cut and the second dice cut.

20 Claims, 8 Drawing Sheets

PRECISION DICED ALIGNING SURFACES FOR DEVICES SUCH AS INK JET PRINTHEADS

BACKGROUND OF THE INVENTION

1. Field of the Invention

The present invention relates to methods of fabricating precision aligning surfaces on discrete devices such as, for example, ink jet printheads, and more specifically to methods of fabricating ink jet printheads which can be butted against an aligning substrate to form an extended staggered array printhead.

2. Description of Related Art

Thermal ink jet printheads typically include a heater plate which includes a plurality of resistive heating elements (heater elements) and passivated addressing electrodes formed on an upper surface thereof and a channel plate having a plurality of channels, which correspond in number and position to the heating elements, formed on a base surface thereof. The upper surface of the heater plate is bonded to the base surface of the channel plate so that a heater element is located in each channel. The channel plate usually includes at least one fill hole extending from its upper surface to its base surface which is in direct fluid communication with the channels so that ink is supplied from a source into the channels.

Discrete printheads may be fabricated by forming a plurality of sets of heating elements and a plurality of sets of channels in separate (100) silicon wafers which are later bonded to each other and separated, such as by dicing, to form discrete printhead modules. The sets of heater elements and sets of channels are located on their respective silicon wafers in a plurality of rows and columns to form corresponding matrices thereon. The bonded wafers are separated between each row and column to form the discrete printhead modules. Each discrete printhead module includes a portion of the wafer containing the heater elements (known as a heater plate) and a portion of the other wafer containing a set of channels (known as a channel plate). After forming the discrete printhead modules, a plurality of the printhead modules can be aligned and butted against one another on a support substrate, such as a heat sink, to form a pagewidth printhead formed from a linear array of printhead modules. See, for example, FIG. 3D of U.S. Pat. No. 5,000,811 to Campanelli, the disclosure of which is incorporated herein by reference. Alternatively, the pagewidth printhead can have discrete printhead modules staggered on both sides of the support substrate. See, for example, FIG. 17 of U.S. Pat. No. 4,463,359 to Ayata et al, the disclosure of which is staggered array, the discrete printhead modules are aligned on the support substrate by butting each module against an aligning member of an aligning substrate and then bonding the aligned modules to the support substrate.

A critical part of the assembly lies in the precise butting of adjacent modules (of a linear array), or of modules against the aligning member (for a staggered array). This can only be accomplished if a precision butting (or aligning) surface is provided on the modules. Such precision is made difficult since the printhead modules comprise a plurality of components (e.g., channels or heater elements) closely spaced thereon. In order to ensure that the components of each module are aligned with each other, the butting surfaces of the modules must be located as precisely as possible relative to the end components on the plates.

FIG. 1A shows a butting edge of a printhead module formed by a single through cut. A first wafer 10 containing a plurality of sets of channels on one surface thereof is bonded to a heater element containing surface of a second wafer 12. A dicing blade 100 is then used to cut through the bonded wafers 10 and 12 to define side edges of discrete printhead modules 13. FIG. 1A shows the source of errors associated with the single pass dicing cut. The dicing blade 100 cuts a V-groove creating a beveled edge with a variable angle $\theta$. The angle $\theta$ generated by the dicing blade 100 causes cut placement error from module to module, and more importantly from wafer to wafer due to the non-vertical nature of the through-cut. The angle $\theta$ error is caused by: depth of cut, cooling (the blade is cooled with water—if one side of the blade is cooled more than the other, thermal expansion will cause the blade to bend), blade wear on the side of the blade, and blade fatigue (i.e., blade stiffness loss due to thermal and mechanical stress). The error caused by angle increases with blade exposure (i.e., the distance blade 100 extends beyond supporting flange 102). The deeper the cut, the more blade exposure is required.

The individual printhead modules 13 formed by this method are aligned on an alignment substrate 15 and then bonded to a support substrate, such as a heat sink 17 to form a staggered array printhead. Printhead modules are usually bonded to both sides of support substrate 17 in staggered form. As shown in FIG. 1B, the printhead modules are aligned in one direction on alignment substrate 15 by butting one of their beveled side edges against a corresponding aligning member 50. Preferably, the aligning member is sized so that it will contact the printhead module 13 close to the component surface thereof (the electronic surface of the heater plate and the channel surface of the channel plate). Aligning errors between each printhead module and aligning member are introduced because: a) the alignment surface of the printhead module (the component surface of each plate) corresponds to an area of the dicing blade which is not well supported (this portion of the dicing blade is located far from flange 102); and b) misalignments between the channel plate and heater plate are transferred to the butting operation if the aligning member abuts the heater plate.

U.S. Pat. No. 5,000,811 to Campanelli discloses a method of fabricating a buttable edge surface in a substrate comprising sawing at least one backcut in a base surface of the substrate with a standard dicing blade and cutting at least one precision through cut on an upper surface of the substrate with a resinoid dicing blade corresponding to the backcut to form a buttable surface for the substrate. The method in particular is directed toward a method of fabricating a buttable aligning surface for an ink jet printhead module consisting of a heater plate and a channel plate. After a heater-element-containing-substrate and a channel-containing-substrate have been bonded together, a backcut is made on a back side of the heater-element-containing-substrate. The backside of the heater-element-containing-substrate is the adhesively mounted to a support surface. A precision through cut, aligned with the backcut, is then made from a top side of the channel-containing-substrate to cut through the channel and heater substrates without cutting into the support surface. The backcut reduces the length of a vertical butting surface formed on the resulting printheads and eliminates a non-linear portion of the through cut. One drawback of this method is that the buttable-surface defining cut (the precision through cut) cannot be visually aligned with the channels because the channels are located between the bonded substrates. Another drawback is that cuts must be formed in both sides of the bonded substrate pair, increasing handling of the substrates (i.e., a flipping step is required, and the flipped bonded substrate pair must then be realigned to a dicing jig).

U.S. Pat. No. 4,878,992 to Campanelli discloses a method of fabricating thermal ink jet printheads from two mated substrates (channel wafer/heater wafer) by two dicing operations. One dicing operation cuts completely through the channel wafer and produces a nozzle face by using a resin based blade having a predetermined thickness and diameter. After the first cut, a second cut is made by a standard blade which may have a smaller thickness. The second cut is directed into a groove made by the first cut and completely severs the bonded substrate (including heater plate wafer) into rows of printheads. The second dicing blade is then used to cut the individual rows of printheads into individual printheads. The use of the resin based blade for the first cut provides an improved nozzle face surface.

Japanese Laid-Open Patent Application No. 58-52846 discloses a semiconductor device which is formed by two step dicing. The semiconductor device includes an insulating substrate which is adhered to a supporting substrate. A multi-layered structure substrate is formed by adhering a silicon (Si) substrate on a surface of the insulating substrate. A first dicing step using a first dicing blade forms a groove a prescribed depth into the Si substrate. A second dicing step using a second blade having a width narrower than the first dicing blade is used to cut the remaining part of the Si substrate, the insulating substrate and a part of the supporting substrate.

Japanese Laid Open Patent Application No. 60-157236 discloses a dicing method for a semiconductor in which an adhesion sheet is adhered to a back of a semiconductor substrate where a circuit has been formed. The semiconductor is fully cut or half-cut by a dicing saw. Thereafter, the adhesion sheet is adhered to the front of the semiconductor substrate. The semiconductor substrate is then cut a portion of the substrate thickness by a second saw which is wider than the first.

U.K. Patent Application No. 2,025,107 discloses a method for manufacturing liquid crystal display elements. A pair of glass substrates are spaced and heat bonded to form a plurality of cells. Each cell contains regions in which electrodes are formed. U-section grooves are cut between the regions on an electrode bearing side of the substrates while corresponding linear scratches are made on opposite sides of the substrates. Splitting into individual units is performed by bending the substrates across parallel supports.

Other patents of interest include: U.S. Pat. No. 4,786,357 to Campanelli et al; U.S. Pat. No. 4,814,296 to Jedlicka et al; U.S. Pat. No. 4,829,324 to Drake et al; and U.S. Pat. No. 4,851,371 to Fisher et al. These patents relate generally to the fabrication of semiconductor devices, and particularly to the fabrication of ROS devices such as ink jet printheads and RIS devices such as image sensors. These patents can be referred to for a more detailed description of conventional processes used in the fabrication of semiconductor devices such as standard and precision dicing techniques as well as channel and heater element forming techniques. The disclosures of these patents are incorporated herein by reference.

Another method is known which produces printhead modules whose lateral butting area is minimized to avoid non-vertical standoff. This method requires three separate dice cuts, as shown in FIGS. 2A–C. A channel plate wafer 10 and a heater plate wafer 12 are bonded together to form a sandwich 14. The sandwich 14 is diced from the top by a first clearance cut 16, followed by a precision cut 18, then followed by a cut 20 from a bottom of the heater plate wafer 12 to produce printhead modules 13 having buttable edges 24. The printhead modules 13 can then be butted against an aligning member 50 on an alignment fixture 15 (see FIG. 3A) to form a staggered array. Alignment fixture 15 includes a lower planar substrate, an extended planar front wall 51, and a plurality of planar aligning members 50. The front wall 51 and the plurality of members 50 define a plurality of recesses into which a corresponding printhead module 13 is placed. The buttable edge 24 on one side of each module is butted against one side of member 50 to align that module in one direction. The nozzle-containing surface of each printhead module is butted against front wall 51 to align all of the modules in another, perpendicular direction (the nozzles of each printhead are shown in FIG. 3A for clarity, however it is understood that the nozzles would face in the opposite direction from what is shown, i.e., toward front wall 51). For more details of this alignment substrate and method for forming a staggered array, see FIG. 7 of U.S. patent application Ser. No. 07/542,053, filed Jun. 22, 1990, now U.S. Pat. No. 5,065,170, by Ivan Rezanka et al, and entitled "An Ink Jet Printer Having a Staggered Array Printhead". Alternatively, adjacent printhead modules could be butted against each other to form a linear array as shown in FIG. 3B. The printhead modules 13 are bonded to a support substrate 17, such as, for example, a heat sink, using adhesive 19.

One drawback of this process is that the last cut 20 requires flipping the wafer over during manufacture. This step is disadvantageous due to the added time required to perform the flipping operation which increases production costs and reduces production rates. Additionally, as with the example of FIGS. 1A–B, the portion of the dicing blade which forms the butting surface on each module is located far from the blade support.

It is desirable to form lateral aligning surfaces on semiconductor devices having a minimum height to avoid the above discussed non-vertical standoff problem. Minimizing the height of the aligning surface reduces lateral standoff which occurs due to any non-vertical portions of the aligning surfaces. For a further description of non-vertical standoff, see FIGS. 1–4 of U.S. Pat. No. 4,851,371.

It is also desirable to use a precision dice cut to define the aligning surface. However, since precision cutting blades (which are preferably used when forming precision dice cuts) are expensive and bend when forming deeper cuts, it is desirable to minimize the depth of any cut made with a precision cutting blade. This increases the useful life of the precision cutting blade and reduces the amount of bending which occurs in the blade when cutting.

OBJECTS AND SUMMARY OF THE INVENTION

It is an object of the present invention to provide a method for forming aligning surfaces on semiconductor devices which avoids vertical standoff.

It is another object of the present invention to provide a method of forming an aligning surface on semiconductor devices using a precision cutting blade, wherein only a shallow cut is made with the precision cutting blade so that the useful life of the blade is increased and bending of the blade during cutting is reduced.

It is another object of the present invention to provide a method of delineating discrete semiconductor devices from a larger wafer or substrate, wherein the handling steps are minimized, and the wafer or substrate does not need to be flipped.

It is a further object of the present invention to provide a method of forming aligning surfaces on semiconductor devices wherein the aligning surface is visually aligned with components on the semiconductor device.

To achieve the foregoing and other objects, and to overcome the shortcomings discussed above, a method of fabricating a semiconductor device having a buttable edge (i.e., an aligning surface) from a first wafer having first and second opposite planar surfaces and a second wafer having first and second opposite planar surfaces is disclosed. The method comprises: forming a first component on the first planar surface of the first wafer; placing a precision dice cut in the first planar surface of the first wafer closely adjacent to the first component, the precision dice cut extending partially through the first planar surface of the first wafer and defining a buttable side edge; bonding the first planar surface of the first wafer to the first planar surface of the second wafer, the first planar surface of the second wafer containing a second component and being aligned with and bonded to the first wafer so that the first and second components cooperate to form the semiconductor device; and removing portions of the first and second wafers surrounding the first and second components to define the semiconductor device wherein said buttable side edge remains substantially intact and defines an aligning side surface of said semiconductor device.

The removing step can include placing a second dice cut entirely through the first and second wafers parallel to and slightly offset from the precision dice cut. The second dice cut is located slightly further away from the first component than the precision dice cut and intersects a portion of the precision dice cut so that a side of the semiconductor device which includes the buttable edge is defined by the precision dice cut and the second dice cut.

More specifically, the present invention relates to methods of fabricating precision aligning surfaces for thermal ink jet printhead modules. The method may be used, for example, to fabricate a pagewidth ink jet printhead from a staggered array of discrete ink jet printhead modules. Each module is manufactured by providing a shallow precision dice cut which defines a lateral aligning surface having a minimal height in the surface of a channel-plate defining substrate adjacent to each set of channels. The channel-plate defining substrate is bonded to a heater-plate defining substrate. The bonding is followed by a low precision standard through cut to delineate the modules from the pair of bonded substrates.

The channels and heater elements can be formed in (100) silicon wafers according to existing technologies. Before bonding of a channel plate wafer to a heater plate wafer, the channel plate wafer is diced using a shallow, precisely placed and stepped cut. The cut is placed on a channel side of the channel plate wafer so that the precision cut can be made with a visual reference to an end channel of an array of channels which will define a discrete printhead module. The channel plate wafer is then bonded to the heater plate wafer to form a sandwich. The sandwich then can be diced, preferably by placing a lower precision, standard through cut from a top side of the channel wafer (opposite to the channel side) entirely through the wafer sandwich to separate the sandwich into a plurality of printhead modules.

An additional clearance cut can be made on the top side of the channel wafer adjacent to the through cut to provide additional clearance for easier die bonding assembly. The through cut and the additional clearance cut must be made sufficiently close to the precision cut such that the wafer is completely diced through, while not destroying the precision cut and in particular, not destroying a vertical aligning surface defined by the precision cut.

The use of the shallow precision cut provides numerous advantages. A shallow cut has a higher through-put than a deeper cut. It also reduces the wear on any precision dicing blade used, and allows the use of a smaller diameter blade (wherein less of the blade extends beyond its supporting flange) which increases the rigidity of the blade, reducing blade bending and thus, the precision tolerances of the blade. By making the precision shallow cut on the channel side of the channel plate wafer, a higher degree of precision can be achieved since a visual reference to the end channel of the array of channels can be obtained. Additionally, since the aligning surface is on the channel plate portion of each module, misalignment between each channel plate and heater plate is not translated to the butting of the module against an aligning member. This allows the present invention to provide a buttable module which provides not only a precise buttable vertical surface, but additionally provides better control of lateral registration and alignment of a plurality of modules to form a printhead array. Additionally, the sandwich does not need to be flipped to obtain the final through cut.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 4A:
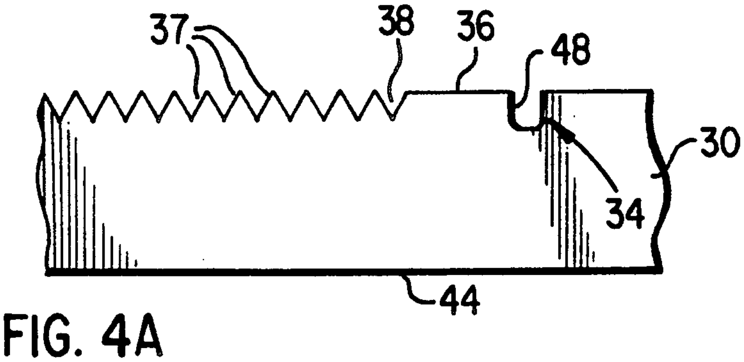
FIGS. 4A–C show side views of one embodiment of a printhead module fabrication method according to the present invention.
Figure 4B:
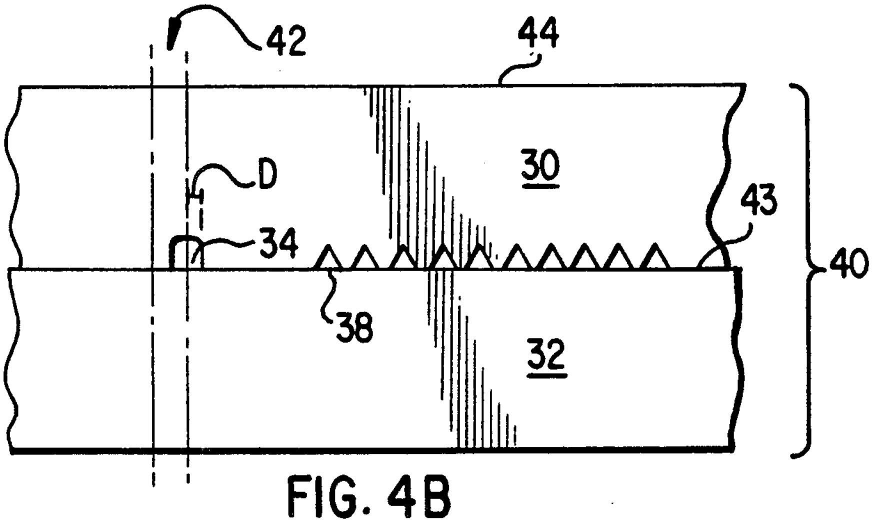
Figure 4C:
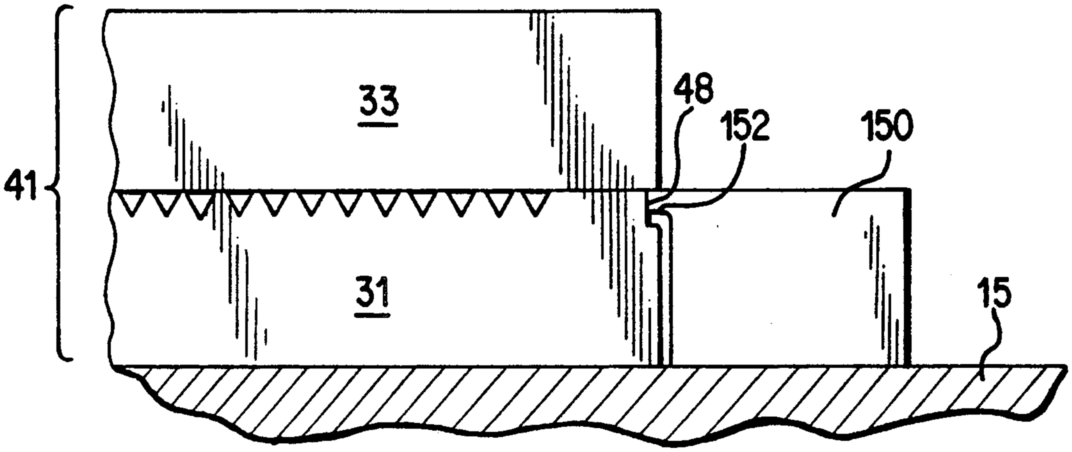

With reference to FIGS. 4A-C, the present invention is used to produce a semiconductor device comprising at least two bonded substrates. A first substrate (or wafer) 30 having first and second opposite planar surfaces 6 and 44, respectively, has formed on the first surface 6 thereof at least one first component. In particular, the wafer can have formed on a first surface 36, a plurality of ink channels or grooves 37 including an end channel 38 and ink supply means 39 (see FIG. 7) to form a plurality of individual channel plates 40 on the wafer 30. A shallow precision dice cut 34 is then formed on first surface 36 of the wafer 30 closely adjacent to the first component, which in this example is the array of channels 37, particularly an end ink channel 38. The precision dice cut 34 extends partially through the first surface 36 of the first wafer 30 and defines a buttable side edge 48. Preferably, the precision cut is made by a resinoid blade such as the blade described in U.S. Pat. No. 4,878,992, the disclosure of which is incorporated herein by reference. A resinoid blade produces no substantial damage to the surfaces of the channel plates, i.e., no more than about 1 micrometer of chipping during dicing.

As defined herein, a precision dice cut is any dice cut made by a precision dicing machine. Precision dicing machines are well known in the art, and use optics or other precision alignment systems which permit the placement of dice cuts in a substrate with a degree of accuracy of ±0.5 micron. While the particulars of the blade are a factor, the blade does not necessarily define a precision cut. For example, metal blades can be used with precision dicing machines to form precision dice cuts. However, after a short period of time, metal blades wear to a point where they begin to chip the substrate being cut. Chips having a size greater than about one micron adversely affect the aligning surfaces on the semiconductor devices. Accordingly, it is preferable to use resinoid blades with the precision dicing machine to form precisely placed, smooth, chipless dice cuts. A three micron diamond grit resinoid blade produces a smooth edge with very little chipping. A larger grit (6-9 micron) blade also produces a smooth edge, but with more chipping. If the dice cut is deep enough, the larger diamond grit can be used because any chips will not extend the entire depth of the cut (i.e., some smooth, chipless surface exists for forming the aligning surface). For example, a 10 mil deep precision cut formed in (100) silicon with the larger diamond grit produces an acceptable aligning surface.

Thus, as defined herein, a "precision cut" is any cut made with a precision dicing machine. The type of blade which is used depends on the particular application, the length of time between changing blades, the depth of the cuts, and the amount of chipping which can be tolerated. One advantage of metal blades is that they are stiffer and bend less than resinoid blades. However, as explained above, metal blades quickly start to chip (100) silicon. Since shallow cuts require a smaller diameter blade (which do not bend as much as larger diameter blades), resinoid blades are preferably used with the described embodiment of the present invention, since blade bending will be minimal.

After making precision cut 34, the first surface 36 of the first wafer 30 is bonded to a first surface 43 of a second wafer 32. The first surface 43 of the second wafer contains a second component and is aligned with and bonded to the first wafer 30 so that the first and second components cooperate to form a semiconductor device. The bonding may be performed by methods well known in the art.

In this example, the channel side of a (100) silicon channel plate wafer 30 is bonded to a heater element side of a (100) silicon heater plate wafer 32 to form a sandwich 40. The heater plate wafer 32 comprises at least one set of resistive heater elements and passivated addressing electrodes which correspond in number and location to the ink channels of the channel plate wafer 30. After bonding, the precision shallow dice cut 34 is located on the inside of the sandwich as shown in FIG. 4B.

A second dice cut 42 is placed entirely through the first and second wafers parallel to and slightly offset from the first precision dice cut 34. The second dice cut is located slightly further away from the first component than the precision dice cut 34 and intersects a portion of the precision dice cut 34 so that a side of the semiconductor device which includes the buttable edge 48 is defined by the precision dice cut 34 and the second dice through cut 42. Preferably, the through cut 42 is made from a second side 44 of the channel wafer 30 (opposite to first side 36) to separate the sandwich into a plurality of printhead modules 40. The second dice cut 42 may be a lower precision, standard dice cut. A precision dice cut is not required for through cut 42 because the precision butt edge (aligning edge) is already formed, the second dice step being provided to separate the wafer into individual semiconductor devices, not to provide a precision aligning surface.

Preferably, both cuts 34 and 42 are cut parallel to the end channel groove 38. The finished semiconductor device may easily be aligned with aligning surfaces on an aligning substrate to form a staggered array of printhead modules. FIG. 4C shows a portion of a discrete printhead module 41 formed by the present invention and comprising the bonded channel plate 31 and heater plate 33 aligned with an aligning member 150 on an aligning substrate 15. Heater plate 33 and channel plate 31 are the respective portions of the heater wafer 32 and channel wafer 30 which are delineated therefrom after all dicing is completed to form discrete printhead modules. Aligning member 150 includes a protrusion 152 which mates with the buttable edge 48 to precisely align the printhead module 41 on the substrate 15. Once a plurality of printhead modules are aligned on substrate 15, a support substrate is bonded to the aligned modules to form a staggered array in a manner similar to that shown in FIG. 3A.

Figure 3A:
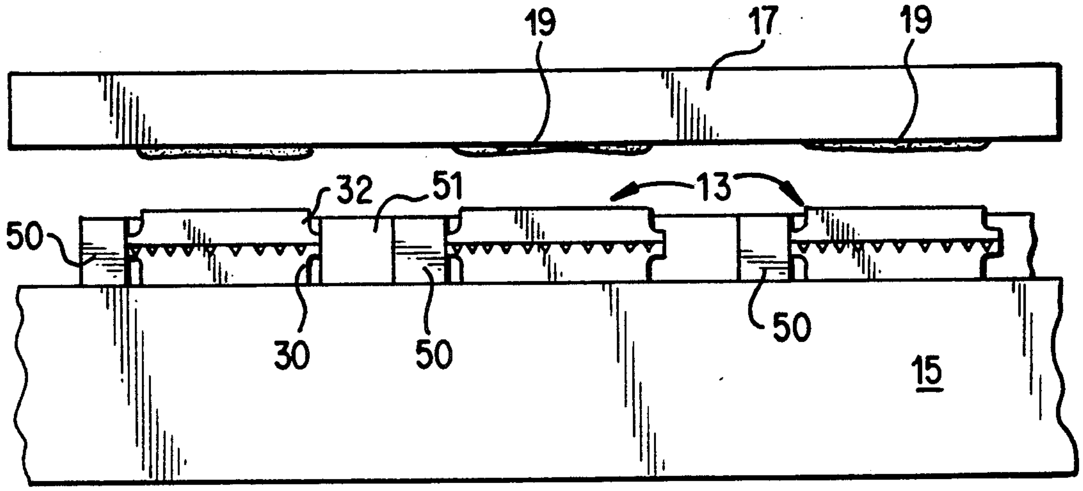
FIG. 3A PRIOR ART
FIGS. 3A–B show side views of a method of using the printhead modules formed by the process of FIGS. 2A–C to form a staggered array and a linear array pagewidth printhead, respectively.
Figure 3B:
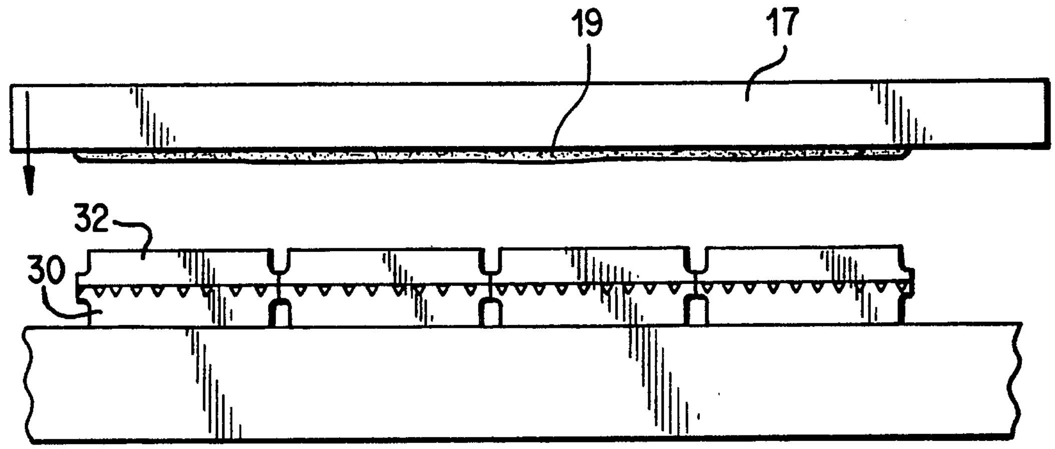
FIG. 3B PRIOR ART

Alignment substrate 15 in FIG. 4C is similar to the alignment substrate illustrated in FIG. 3A except that aligning member 150 in FIG. 4C differs from aligning member 50 in FIG. 3A. Since the precisely defined aligning surface 48 on the printhead modules fabricated by the present invention are recessed in the side surface of each module (i.e., heater plate 33 and a portion of channel plate 31 extend outwardly beyond aligning surface 48), the portion (152) of the aligning member 150 which butts against the module aligning surface 48 must protrude outwardly therefrom. Since the vertical butting interface between aligning surface 48 and protrusion 152 (which has a precisely defined surface thereon) is very small, non-vertical stand-off between the module 41 and the aligning member 150 is minimized. The alignment substrate 15 will be discussed in more detail below.

Figure 5A:
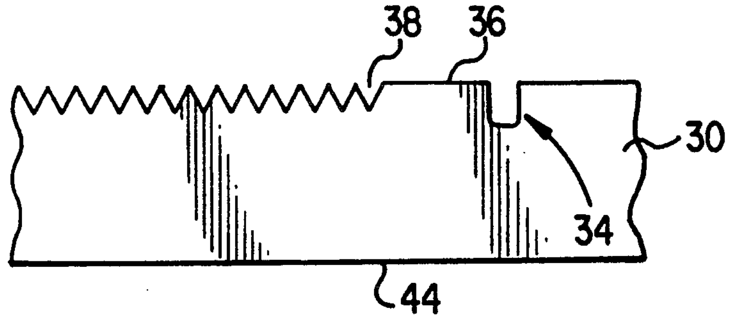
FIGS. 5A-C show side views of an alternative embodiment of a printhead module fabrication method according to the present invention.
Figure 5B:
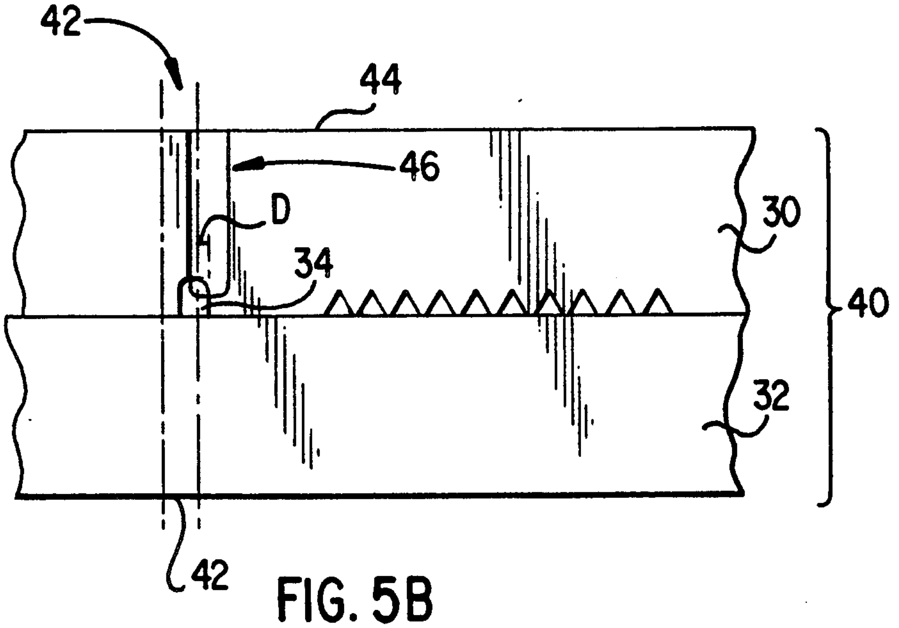
Figure 5C:
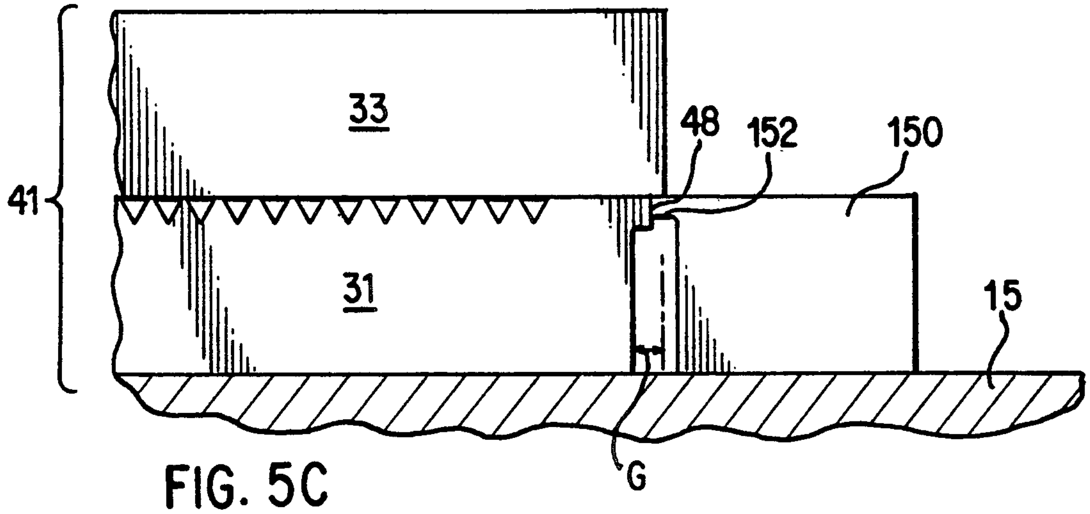

According to another embodiment of the present invention, as shown in FIGS. 5A–C, the precision dice cut 34 and the through dice cut 42 can be performed as described above, followed by an additional clearance cut 46 which is made to provide additional clearance for easier die bonding assembly. This additional clearance cut 46 creates a gap G in the channel plate which provides an important advantage. When a plurality of printhead modules are butted against the protrusions 152 of a plurality of aligning members 150, and a support substrate (such as substrate 17) is bonded to these printhead modules to form a staggered array, gap G permits the staggered array of modules to be lifted directly vertically off the aligning substrate 15 without first having to shift the array laterally to avoid contact between the outwardly extending portion of channel plates 31 and the protrusions 152. Without the additional clearance cut 46, the array must be moved laterally (to the left in FIG. 4C) to prevent each channel plate 31 from contacting a protrusion 152. Additionally, clearance cut 46 permits the use of an aligning member 150 without a protrusion 152.

The through cut 42 and the additional clearance cut 46 must be made sufficiently close to the precision cut 34 such that the wafer pair is completely diced through, without destroying the precision cut 34 so that the vertical aligning surface 48 defined by the precision cut 34 is not destroyed.

Any depth of the shallow precision dice cut 34 which does not completely penetrate through the first wafer member is acceptable. Preferably, the precision dice cut depth for either of the embodiments is in the range between 1–10 mils, preferably about 0.005 inches (5 mils). Variations of this depth may be required due to semiconductor device thickness, material, dicing blade composition, etc. The depth allows an adequate vertical butting surface which is minimal in height. The shallow cut also increases throughput, i.e., the speed at which the shallow cut can be made.

The preferred location of the second cut 42 is in the range between 0.5–10 mils, preferably about 0.001 inches (1 mil) further away from the first component (e.g., end ink channel 38) than the precision dice cut 34, as shown in FIGS. 4B and 5B as distance D. This ensures that the second cut 42 will not destroy the precision cut, while minimizing the overhang (the outwardly extending portion) of the non-precision cut portions.

Figure 2A:
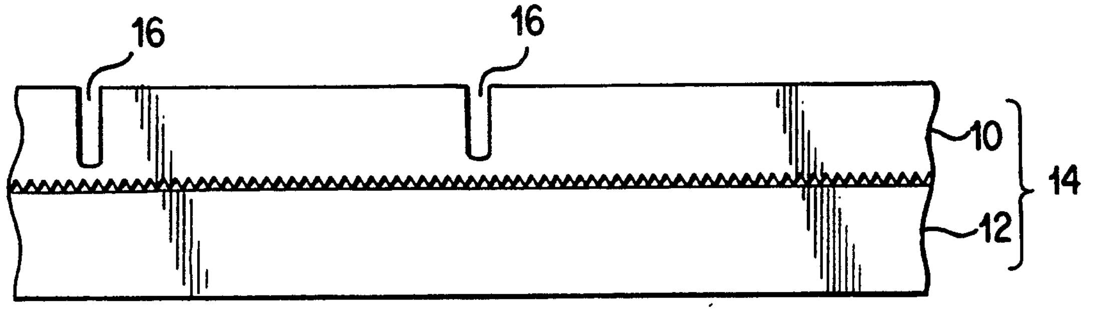
FIG. 2A PRIOR ART
FIGS. 2A–C show side views of a prior art printhead fabrication dicing method of providing a buttable surface on an ink jet printhead module.
Figure 2B:
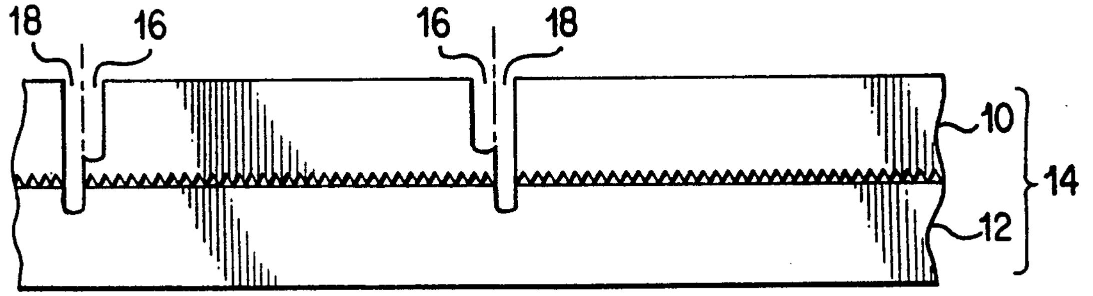
FIG. 2B PRIOR ART
Figure 2C:
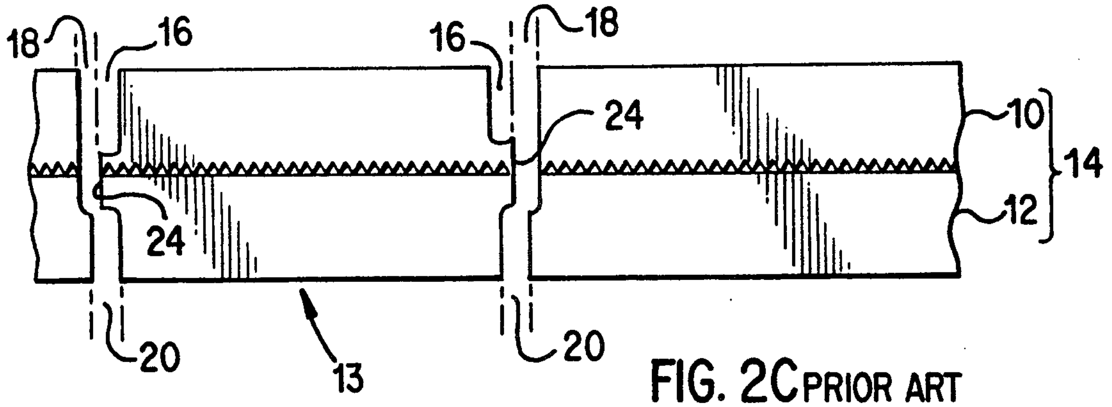
FIG. 2C PRIOR ART

Use of the shallow precision cut 34 in either of these embodiments provides numerous advantages. A shallow cut 34 has a higher throughput than a deep cut, since a smaller amount of material is being removed. It also reduces the wear on the precision dicing blade and allows the use of a smaller diameter blade which increases the rigidity and thus, the precision tolerances of the blade. That is, since the smaller diameter blade extends only a short distance beyond its supporting flange 152, very little blade bending will occur. By making the precision shallow cut on the channel side 36 of the channel plate wafer 30, a higher degree of precision can be achieved since a visual reference to end channel 38 in the array of channels 37 can be obtained. Additionally, locating the aligning surface on the channel plate 31 eliminates any misalignments between the channel plate 31 and the heater plate 33 from affecting the butting operation. This allows the present invention to provide a buttable module which provides not only a precise vertical aligning surface, but additionally provides better control of lateral registration and alignment of a plurality of modules to form a printhead array. That is, since the end channel 38 in each discrete printhead module can be more accurately located relative to that module's buttable aligning surface 48, the channels 37 (and thus the nozzles) of each printhead module are consistently aligned the same distance from the end of its corresponding protrusion 152 of the aligning substrate 15. Additionally, the prior art example shown is FIGS. 2A–C requires flipping of the wafer sandwich to obtain the final cut. This step is eliminated because all cuts made to the wafer sandwich are made from the same side, for example, surface 44 of first wafer 30.

Figure 6:
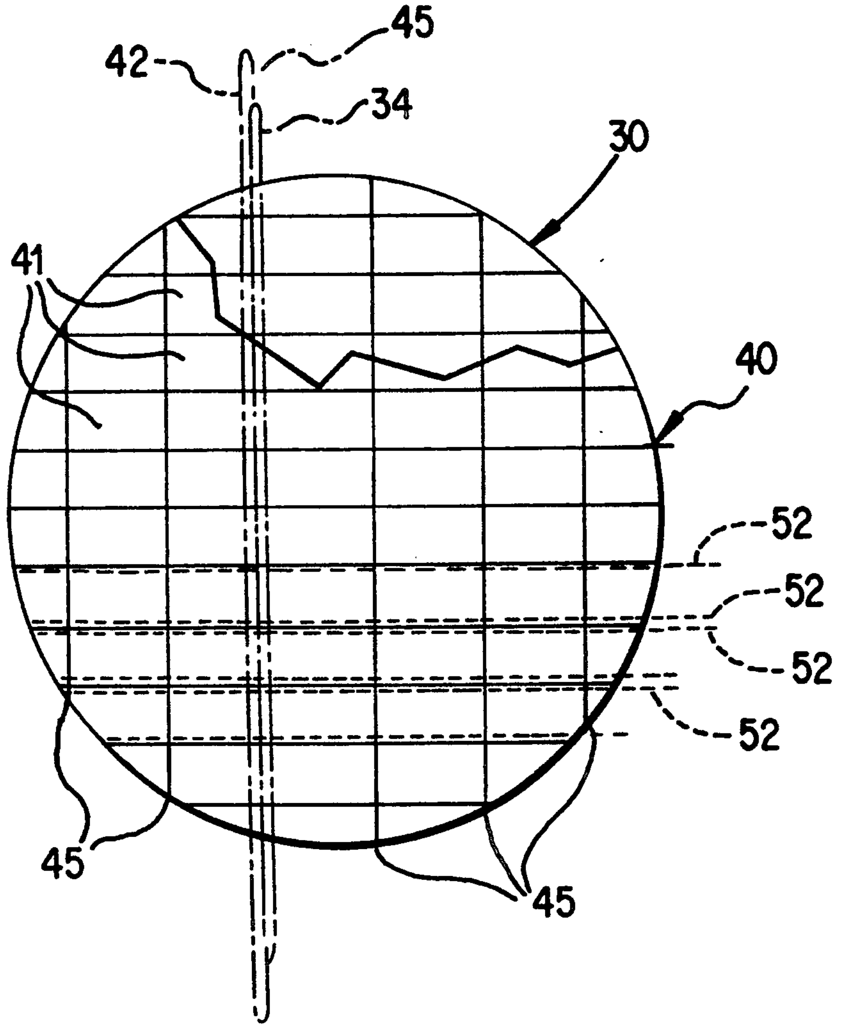
FIG. 6 shows a plan view of a wafer having a matrix of components for forming a plurality of discrete semiconductor devices according to the present invention.

FIG. 6 is a plan view of a bonded channel plate wafer and heater plate wafer pair with a portion of the heater plate 40 cut-away to illustrate the channel plate wafer 30. Each wafer 30, 40 includes a plurality of sets of its corresponding components thereon. The plurality of sets of components (heater elements and passivated addressing electrodes on the heater plate wafer 40; sets of channels and ink supplying fill holes on the channel plate wafer 30) are arranged in a plurality of rows and columns to form a matrix of components thereon. The locations of the aligning surface defining cuts are denoted by numeral 45. Each cut 45 includes a shallow precision cut 34 and a through-cut 42. One pair of shallow precision dice cuts 34 and through cuts 42 is illustrated by broken lines in FIG. 6. Additional dice cuts 52 which are made perpendicular to dice cuts 45 extend entirely through the wafer sandwich to define front and rear portions of each discrete printhead module 41.

Figure 7:
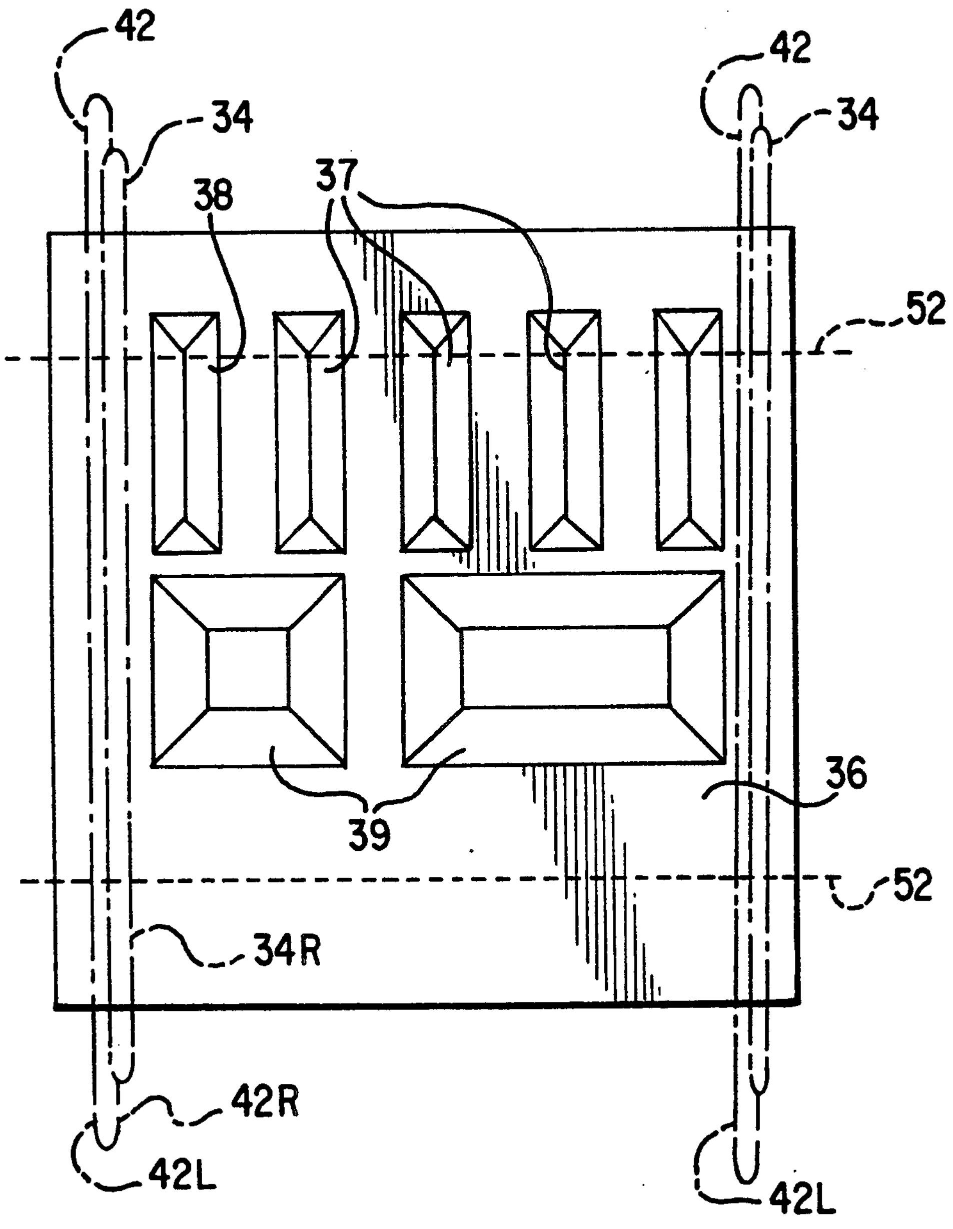
FIG. 7 shows a plan view of a channel plate for use with the present invention and illustrates the location of dice cuts.

FIG. 7 illustrates the upper surface 36 of a portion of channel wafer 30. The locations of the precision dice cut 34 and the standard through dice cut 42 are also illustrated in FIG. 7. A righthand portion 34R of the precision dice cut defines the buttable aligning surface 48. The righthand portion 42R of the throughcut 42 defines the overhang portion of the remainder of the printhead (it is understood that through cut 42 is not made until after wafer 30 is bonded to wafer 40.

The lefthand portion 42L of the standard dice cut 42 from an adjacent row defines the side of the printhead module opposite from the aligning surface containing side.

The locations of the perpendicular cuts 52 is also illustrated in FIG. 7. As can be seen from FIG. 7, the perpendicular cut 52 which defines the nozzle-containing front face of the printhead module intersects the channels 37 to define the nozzles.

In order to fabricate a plurality of discrete thermal ink jet printheads from first and second substrates, a plurality of fluid handling elements are formed on a first planar surface of a first substrate (e.g., a (100) silicon wafer). Each fluid handling element includes a set of parallel grooves 37 and ink supply means (such as ink fill holes 39 in FIG. 7). One end of each of the parallel grooves (or channels) is communicated with the ink supply means by techniques well known in the art. See, for example, the above-incorporated U.S. Pat. No. 4,829,324, and U.S. Pat. No. 4,774,530 to Hawkins, the disclosure of which is incorporated herein by reference.

A plurality of sets of resistive heating elements and passivated addressing electrodes are then formed on a first planar surface of the second substrate (e.g. another (100) silicon wafer). The plurality of sets of resistive heating elements and passivated addressing electrodes correspond in number and location to the plurality of fluid handling elements on the first substrate. The plurality of fluid handling elements and the plurality of sets of resistive heating elements and passivated addressing electrodes are arranged on their respective substrates in a plurality of rows and columns to form a matrix as shown in FIG. 6. A shallow precision dice cut is then placed closely adjacent to at least one side of each column of fluid handling elements on the first planar surface of the first substrate. The shallow precision dice cuts extend partially into the first planar surface of the first substrate. The first planar surface of the first substrate is then bonded to the first planar surface of the second substrate so that each set of fluid handling elements is aligned with and bonded to a corresponding set of resistive heating elements and passivated addressing electrodes. A second dice cut is then placed in the first and second substrates. The second dice cut (the through cut 42) extends entirely through the first and second substrates parallel to and slightly offset from each precision dice cut. Each second dice cut is located slightly further away from a corresponding column of fluid handling elements than the precision dice cut associated with the corresponding column of fluid handling elements and intersects a portion of the precision dice cut. The second dice cuts form a plurality of columns of bonded fluid handling elements and corresponding sets of resistive heating elements. These columns are then separated (for example, using dice cuts 52) to form the plurality of discrete thermal ink jet printhead modules. If necessary, the clearance cut 46 can also be made in the bonded substrate pair.

When this process is used to form ink jet printhead modules, a plurality of these modules can be bonded to opposite sides of a support substrate (such as, for example, a heat sink) in staggered fashion, as illustrated in FIG. 3A (except that an aligning member 150 is substituted for each aligning member 50) to form a pagewidth ink jet printhead.

Figure 1A:
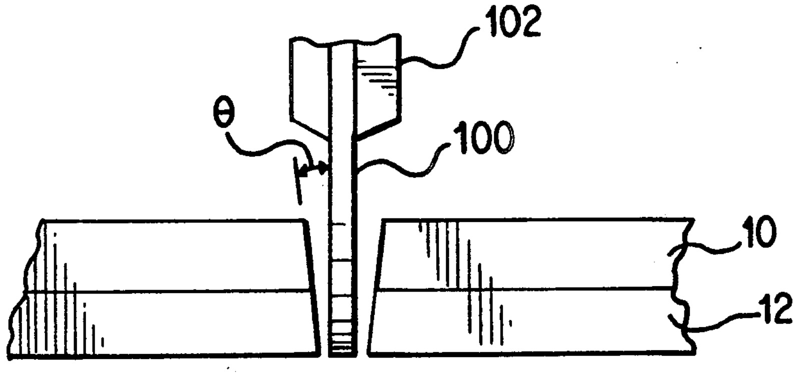
FIG. 1A PRIOR ART
FIG. 1A is a side view of a single pass dice cut for forming an aligning surface on a printhead module.
Figure 1B:
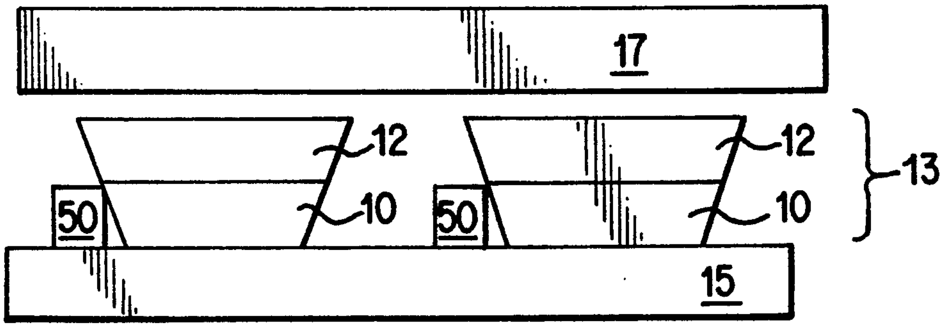
FIG. 1B PRIOR ART
FIG. 1B is a side view of printhead modules formed by the FIG. 1A method butted against aligning members for forming a staggered array printhead.

The precision diced shallow groove cut in the channel wafer enables the butt edge to be located to within ±1 micron from module to module and wafer to wafer, while, for example, the single pass dice cut method of FIG. 1A results in an accuracy of ±10 micron from module to module and wafer to wafer. This is because with the present invention, the aligning surface of each module is formed by a portion of the dicing blade that is within 5-10 mils of its supporting flange 102. Additionally, since the total exposure of the aligning surface defining blade is reduced from about 60 mils (in the single pass method of FIG. 1A) to about 20 mils, the angle $\theta$ is very small.

Figure 8A:
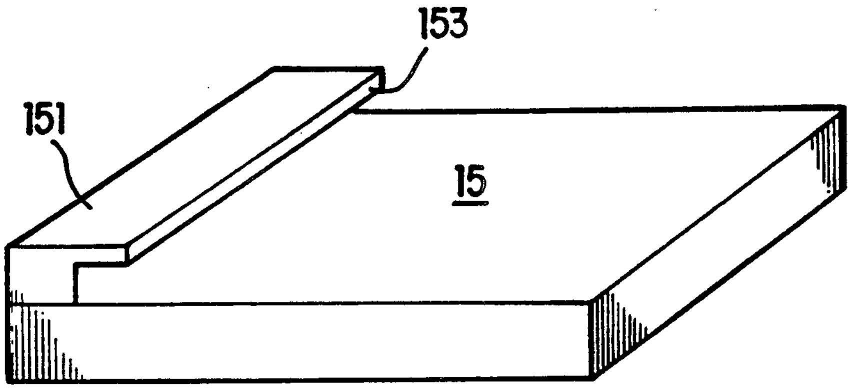
FIGS. 8A and 8B are perspective views of aligning fixtures which can be used to form pagewidth printhead arrays.
Figure 8B:
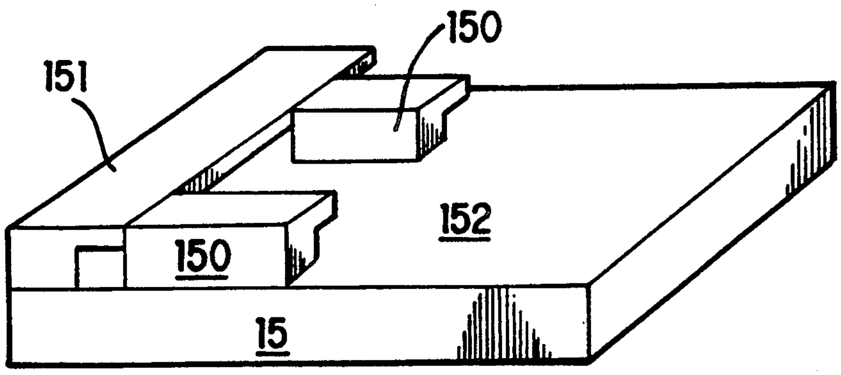

FIGS. 8A and 8B are perspective views of aligning fixtures which can be used to more accurately form page-width arrays. The aligning fixtures include planar substrates 15 upon which the printhead modules are placed. Usually, the fill-hole containing side of the channel plates are placed on substrate 15 so that the bottom of the heater plates face upward. The nozzle containing surface of each printhead module is then butted against planar front wall member 151. Unlike previous aligning fixtures, the reference edge 153 is a protrusion formed by placing perpendicular, intersecting dice cuts in a silicon bar. Protrusion 153 defines an elevated, reduced vertical length butting surface for contacting the printhead modules. The reduced vertical length of protrusion minimizes vertical standoff between each printhead module and front wall member 153. The elevated position of protrusion 153 permits dirt and debris to collect beneath protrusion 153, where it will not interfere with the butting operation. The reduced vertical length of protrusion 153 also serves to reduce the butting area where dirt and debris can interfere. The height of front wall member 151 can be about 15 mil, and thus is less than the channel plate thickness. Accordingly, the individual nozzles can be viewed over front wall 151 when printhead modules are butted against front wall 151.

The aligning fixture of FIG. 8A can be used to form linear arrays of printhead modules, or modified, as shown in FIG. 8B for use in forming staggered array printheads. To form a staggered array, a plurality of side wall aligning members 150 are added to the FIG. 8A aligning fixture for side registering a plurality of printhead modules. Each side wall aligning member 150 includes a reference edge defining protrusion 152 which contacts the aligning surface 48 on the channel plate of a printhead module as explained earlier. Each side wall aligning member 150 can be formed by placing two perpendicular, intersecting dice cuts in a silicon strip as was done to form front wall aligning member 151. The side wall aligning members 150 are butted against member 151 and bonded to substrate 15.

The aligning fixtures of FIGS. 8A and 8B can be used to form linear and staggered array printheads from printhead modules formed by the present inventive method, or by other methods. That is, by providing an elevated, reduced vertical length butting surface, the aligning fixtures of FIGS. 8A and 8B can be utilized to reduce vertical standoff and misalignment due to dust and debris in any aligning operation which uses butting.

The invention has been described with reference to the preferred embodiments thereof, which are illustrative and not limiting. For example, the shallow precision dice cut can be formed on the heater element containing substrate instead of on the channel containing substrate. Additionally, substrates other than (100) silicon wafers can be used to form the printhead modules. Moreover, the present invention is also applicable to semiconductor devices other than thermal ink jet printheads, generally to any device constructed from substrate sandwiches and requiring a precisely defined side surface. Various changes may be made without departing from the spirit and scope of the invention as defined in the appended claims.

What is claimed is:

1. A method of fabricating a semiconductor device from a first wafer having first and second opposite planar surfaces and a second wafer having first and second opposite planar surfaces, said semiconductor device having a buttable side edge, comprising:

a) forming a first component on said first planar surface of said first wafer;

b) placing a precision dice cut in said first planar surface of said first wafer closely adjacent to said first component, said precision dice cut extending partially through said first planar surface of said first wafer and defining said buttable side edge;

c) bonding said first planar surface of said first wafer to said first planar surface of said second wafer, said first planar surface of said second wafer containing a second component and being aligned with and bonded to said first wafer so that said first and second components cooperate to form said semiconductor device; and d) removing portions of said first and second wafers surrounding said first and second components, respectively, to define said semiconductor device, said removing including placing a second dice cut entirely through said first and second wafers parallel to and slightly offset from said precision dice cut, said second dice cut being located slightly further away from said first component than said precision dice cut and intersecting a portion of said precision dice cut so that a side of said semiconductor device which includes said buttable edge is defined by said precision dice cut and said second dice cut.

2. The method of claim wherein said first component is an array of channel forming grooves and said second component is an array of resistive heater elements and passivated addressing electrodes so that said semiconductor device is a thermal ink jet printhead.

3. The method of claim 2, wherein said precision dice cut and said second dice cut are parallel to said channel forming grooves.

4. The method of claim 1, further comprising:

placing a third dice cut parallel to and overlapping with said second dice cut in said first wafer, said third dice cut extending partially through said first wafer from said second planar surface of said first wafer to said precision dice cut and being located closer to the first component than the precision dice cut.

5. The method of claim 1, wherein the depth of said precision dice cut is in the range between 1-10 mils.

6. The method of claim 1, wherein said second dice cut is located in the range between 0.5-10 mils further away from the first component than the precision dice cut.

7. The method of claim 1, wherein said first and second wafers are made from silicon.

8. A method of fabricating a plurality of discrete semiconductor devices from a first wafer having first and second opposite planar surfaces and a second wafer having first and second opposite planar surfaces, comprising:

a) forming a plurality of first components on said first planar surface of said first wafer, said plurality of first components located on said first planar surface of said first wafer in a plurality of rows and columns to form a matrix of said first components;

b) placing a precision dice cut between each of said columns of first components, each precision dice cut located closely adjacent to one side of each column of first components and extending a shallow depth into said first planar surface of said first wafer;

c) bonding said first planar surface of said first wafer to said first planar surface of said second wafer, said first planar surface of said second wafer containing a plurality of second components in the form of a matrix and corresponding in number and location to said plurality of first components so that each of said plurality of second components is cooperated with a corresponding one of said first components;

d) placing a second dice cut which extends entirely through said bonded first and second wafers parallel to and slightly offset from each of said precision dice cuts, each of said second dice cuts located slightly further away from a corresponding column of first components than the precision dice cut associated with the corresponding column of first components; and e) separating each column of bonded first and second components between each of said rows to form the plurality of discrete semiconductor devices.

9. The method of claim 8, wherein each of said first components is an array of channel forming grooves and each of said second components is an array of resistive heater elements and passivated addressing electrodes so that said semiconductor devices are discrete thermal ink jet printheads.

10. The method of claim 9, wherein said precision dice cuts and said second dice cuts are parallel to said channel forming grooves.

11. The method of claim 8, further comprising:

placing a third dice cut parallel to and overlapping with each of said second dice cuts in said first wafer, each of said third dice cuts extending partially through said first wafer from said second planar surface of said first wafer to said precision dice cut and located closer to the corresponding column of first components than the precision dice cut associated with the corresponding column of first components.

12. The method of claim 8, wherein said second dice cut is made from said second planar surface of said first wafer toward said second planar surface of said second wafer.

13. The method of claim 8, wherein the depth of said precision dice cuts is in the range between 1-10 mils.

14. The method of claim 8, wherein said second dice cuts are located in the range between 0.5-10 mils further away from the corresponding column of first components than the precision dice cut associated with the corresponding column.

15. A method of fabricating a plurality of discrete thermal ink jet printheads from first and second substrates, said first substrate having a plurality of fluid handling elements formed on a first planar surface thereof, each fluid handling element including a set of parallel grooves and ink supply means, one end of each set of grooves communicating with said ink supply means, said second substrate having a plurality of sets of resistive heating elements and passivated addressing electrodes formed on a first planar surface thereof, said plurality of sets of resistive heating elements and passivated addressing electrodes corresponding in number and location to said plurality of fluid handling elements, said plurality of fluid handling elements and said plurality of sets of resistive heating elements and passivated addressing electrodes being arranged on said respective first planar surfaces of said first and second substrates in a plurality of rows and columns, said method comprising:

a) placing a precision dice cut closely adjacent to at least one side of each column of fluid handling elements on said first planar surface of said first substrate, each precision dice cut extending partially into said first planar surface of said first substrate;

b) bonding said first planar surface of said first planar substrate to said first surface of said second substrate so that each set of fluid handling elements is aligned with and bonded to a corresponding set of resistive heating elements and passivated addressing electrodes;

c) placing a second dice cut which extends entirely through said first and second substrates parallel to and slightly offset from each precision dice cut, each second dice cut being located slightly further away from a corresponding column of fluid handling elements than the precision dice cut associated with the corresponding column of fluid handling elements and intersecting a portion of the precision dice cut; and separating each column of bonded fluid handling elements and corresponding sets of resistive heating elements and passivated addressing electrodes between each row to form said plurality of discrete thermal ink jet printheads.

16. The method of claim 15, wherein said precision dice cuts and said second dice cuts are parallel to said grooves.

17. The method of claim 15, further comprising:

placing a third dice cut parallel to and overlapping with each of said second dice cuts in said first wafer, said third dice cuts extending from a second surface of said first substrate to said precision dice cuts and located closer to the corresponding column of fluid handling elements than the precision dice cut associated with the corresponding column of fluid handling elements.

18. The method of claim 15, wherein the depth of said precision dice cuts is in the range between 1–10 mils.

19. The method of claim 15, wherein said second dice cuts are located in the range between 0.5–10 mils further away from the corresponding column of fluid handling elements than the precision dice cut associated with the corresponding column.

20. The method of claim 15, wherein said first and second wafers are made from silicon.

* * * * *